(12) United States Patent
Burgoyne, Jr. et al.

(10) Patent No.: US 8,502,401 B2
(45) Date of Patent: Aug. 6, 2013

(54) POLYMERIC COMPOSITIONS COMPRISING PER(PHENYLETHYNYL) ARENE DERIVATIVES

(75) Inventors: William Franklin Burgoyne, Jr., Bethlehem, PA (US); Mark David Conner, New Tripoli, PA (US); Andrew Francis Nordquist, Whitehall, PA (US); William Steven Collins, Macungie, PA (US)

(73) Assignee: Delsper LP, Kulpsville, PA (US)

( * ) Notice: Subject to any disclaimer, the term of this patent is extended or adjusted under 35 U.S.C. 154(b) by 98 days.

(21) Appl. No.: 13/058,688

(22) PCT Filed: Aug. 10, 2009

(86) PCT No.: PCT/US2009/053250
§ 371 (c)(1),
(2), (4) Date: May 11, 2011

(87) PCT Pub. No.: WO2010/019488
PCT Pub. Date: Feb. 18, 2010

(65) Prior Publication Data
US 2011/0260343 A1 Oct. 27, 2011

Related U.S. Application Data

(60) Provisional application No. 61/088,176, filed on Aug. 12, 2008.

(51) Int. Cl.
*H01L 23/29* (2006.01)
(52) U.S. Cl.
USPC .............. 257/792; 257/E23.117; 257/788; 438/780; 438/124; 528/125
(58) Field of Classification Search
USPC .. 257/E23.117, 125, 205, 788, 792; 525/132, 525/524; 174/258; 528/125, 126, 170, 205, 528/219, 222; 438/124, 126, 127, 780; 252/586
See application file for complete search history.

(56) References Cited

U.S. PATENT DOCUMENTS 3,966,729 A * 6/1976 Kovar et al. .................... 544/353
4,731,442 A   3/1988 Lindley et al.
(Continued)

FOREIGN PATENT DOCUMENTS

JP          11315139      11/1999
JP         2000344898     12/2000
(Continued)

OTHER PUBLICATIONS

International Search Report and Written Opinion received in PCT/US2009/053250.
(Continued)

*Primary Examiner* — Chris Chu
(74) *Attorney, Agent, or Firm* — McNees Wallace & Nurick LLC

(57) ABSTRACT

A polymeric composition comprising a first polymer chosen from a poly(arylene ether) polymer including polymer repeat units of the following structure: —(O—$Ar_1$—O—$Ar_2$—O—)$_m$—(—O—$Ar_3$—O—$Ar_4$—O)n- where $Ar_1$, $Ar_2$, $Ar_3$, and $Ar_4$ are identical or different aryl radicals, m is 0 to 1, n is 1 m; a polysulfone, a polyimide, a poly(etherketone), a polyurea, a polyurethane, and combinations thereof and a second polymer comprising a per(phenylethynyl) arene polymer derivative. Cured films containing the polymer can exhibit at least one of the following properties: Tg from 160° C. to 180° C., a dielectric constant below 2.7 with frequency independence, and a maximum moisture absorption of less than 0.17 wt %. Accordingly, the polymer is especially useful, for example, in interlayer dielectrics and in die-attach adhesives.

11 Claims, 1 Drawing Sheet

Semipenetrating Polymer Network with Poly(arylene ether)

⦚⦚⦚⦚ = poly(arylene ether)

∿∿ = second polymer

U.S. PATENT DOCUMENTS

| | | | |
|---|---|---|---|
| 5,658,994 A | 8/1997 | Burgoyne, Jr. et al. | |
| 5,874,516 A | 2/1999 | Burgoyne, Jr. | |
| 6,060,170 A | 5/2000 | Burgoyne, Jr. | |
| 6,346,296 B1 | 2/2002 | McCarthy et al. | |
| 6,818,663 B2 * | 11/2004 | Chu et al. | 514/370 |
| 6,897,267 B2 * | 5/2005 | Narang et al. | 525/524 |
| 7,517,641 B2 * | 4/2009 | Narang et al. | 430/325 |
| 8,236,787 B2 * | 8/2012 | Piccariello et al. | 514/184 |
| 2002/0099158 A1 * | 7/2002 | Godschalx et al. | 526/285 |
| 2004/0013887 A1 | 1/2004 | Hichri et al. | |
| 2004/0158024 A1 * | 8/2004 | Lau et al. | 528/125 |
| 2007/0275627 A1 | 11/2007 | Jung et al. | |
| 2007/0296101 A1 | 12/2007 | DiPietro et al. | |
| 2008/0006797 A1 | 1/2008 | Kawai et al. | |
| 2008/0078267 A1 | 4/2008 | Keller et al. | |

FOREIGN PATENT DOCUMENTS

| | | |
|---|---|---|
| JP | 2002523549 | 7/2002 |
| JP | 2004504424 | 2/2004 |
| JP | 2007317666 | 12/2007 |
| JP | 2009202824 | 9/2009 |
| JP | 2011512430 | 4/2011 |
| WO | 9710193 | 3/1997 |
| WO | 0011096 | 3/2000 |
| WO | 0011096 A1 | 3/2000 |
| WO | 0206366 | 1/2002 |
| WO | 2007139271 A1 | 12/2007 |
| WO | 2008073440 A2 | 6/2008 |

OTHER PUBLICATIONS

Korean Office Action for Korean Patent Application No. 10-2011-7005723 dated Sep. 26, 2012 (including English language translation).

JP Office Action, Patent Application No. 2011-523062, Mailing Date: Nov. 20, 2012, 3708 4J00, Ref. No. B115205.

* cited by examiner

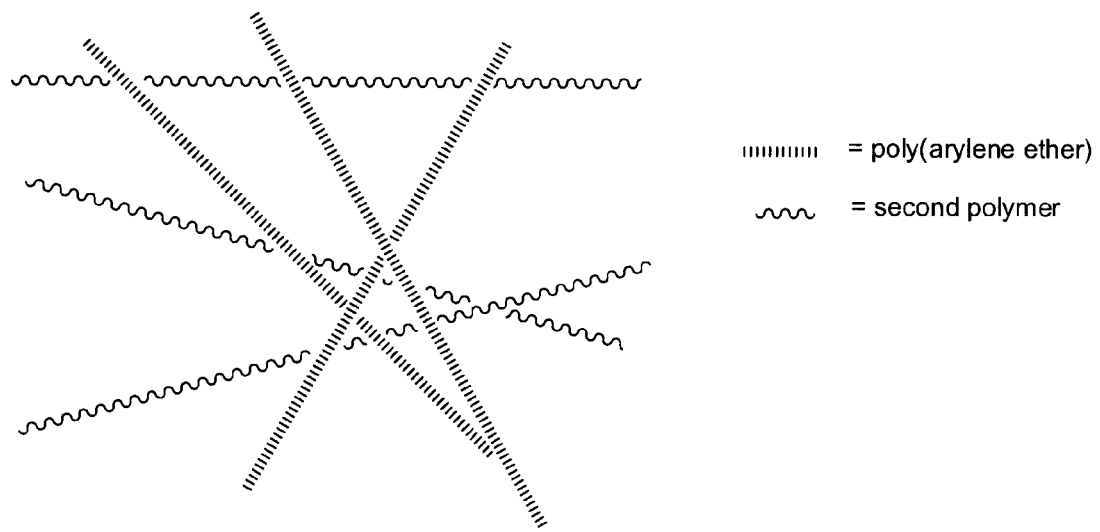
Semipenetrating Polymer Network with Poly(arylene ether)

POLYMERIC COMPOSITIONS COMPRISING PER(PHENYLETHYNYL) ARENE DERIVATIVES

CROSS-REFERENCE TO RELATED APPLICATIONS

This patent application claims the benefit of provisional patent application U.S. Ser. No. 61/088,176, entitled "Polymeric Compositions Comprising Per(phenylethyntyl)arene Derivatives" filed Aug. 12, 2008, incorporated herein by reference.

BACKGROUND

Disclosed herein are polymeric compositions comprising a per(phenylethynyl) arene derivative that can be used, for example, in various electronic applications such as, but not limited to, three dimensional (3D) packaging for IC chip assemblies. Also disclosed are substrates comprising same.

There is a need in the electronic fabrication industry for polymeric materials with materials of lower dielectric values for use as adhesives for 3D packaging of IC chip assemblies. However, the need for materials compatibility and dimensional stability over a wide range of conditions not only during ultimate end use, but also during further processing conditions leading to the finished integrated circuits, have presented significant problems. The properties of polymeric materials should conform to the rigid manufacturing requirements for integrated circuits or microchips in the electronic fabrication industry. One of the problems has been to make a polymeric thermoset system. This problem has been a difficult one to solve, particularly for those high Tg polymers wherein the desired temperature for reaction (cure) may range from 200-450° C.

Polymeric materials can have $\in$ values in the range of 1.9-3.5, which is highly dependent on the structure. It is important that the polymeric material chosen for 3D packaging for IC chip and other applications, such as, for example, multichip module packaging, encapsulation and flat panel display applications, exhibit one or more of the chemical and physical properties described in Table I. The requirements provided in Table I are set forth by various IC manufacturers.

TABLE 1

Summary of Low $\in$, ILD Requirements Set by IC Manufacturers

| | |
|---|---|
| Thermal Stability | Desirable thermal stability >400° C. in vacuum or forming gas (N$_2$ with 4% H$_2$). |
| | CVD Tungsten Deposition: 400-480° C. |
| | CVD Copper Deposition: 250-275° C. |
| Dielectric Constant | 4.0 or lower, or 3.0 or lower, or 2.7 or lower. |
| Moisture Absorption | 0.5 weight % or less |
| Isotropic Dielectric Const. | No anisotropy. Perpendicular and parallel dielectric constants should be the same and uniform across the wafer. |
| High Tg | 400° C. or greater; 300° C. or greater with a relatively high degree of crosslinking. |
| Adhesion to Cu, Al, SiO$_2$ and Si | Depends upon application; adhesion promoters can also be used provided thermal stability is not compromised |
| Low stress | Optimum CTE (coefficient of thermal expansion) would be the same as for SiO$_2$ |
| Patternable | Should be directionally etchable by RIE (reactive ion etching) |
| Chemical Compatibility | Exhibits little to no reactivity with metals; Possible reaction between Al lines and fluorinated polymers at elevated temperatures; Solubility of Cu in some polymers |

TABLE 1-continued

Summary of Low $\in$, ILD Requirements Set by IC Manufacturers

| | |
|---|---|
| No solvent absorption | No swelling due to photoresist solvents. |
| Compatibility with CMP (chemical-mechanical polishing) | Depends upon ultimate 3D process used |

Crosslinking has been recognized as one way to address the requirements of electronic materials polymers. Past attempts used various different approaches for crosslinking polymers. One such attempt is described, for example, in U.S. Pat. No. 6,060,170, which is assigned to the assignee of the present application. The '170 patent describes the use of poly(arylene ether) polymer compositions having aromatic groups grafted on the poly(arylene ether) backbone, whereby the grafts allow for crosslinking of the polymers in a temperature range of from 200 to 450° C. U.S. Pat. No. 5,658,994, which is also assigned to the assignee of the present application, describes the use of poly(arylene ethers) as low dielectric interlayers for the electronics industry wherein the poly(arylene ether) may be crosslinked, for example, by crosslinking itself, through exposure to temperatures of greater than approximately 350° C., or alternatively by providing a crosslinking agent. In addition, the '994 patent also teaches end capping the polymer with known end cap agents, such as phenylethynyl, benzocyclobutene, ethynyl and nitrile.

The references Hedberg, F. L.; Arnold, F. E.; *J. Polym. Sci., Polym. Chem. Ed.* (1976) 14, 2607-19 and Banihashemi, A.; Marvel, C. S.; *J. Polym. Sci., Polym. Chem. Ed.* (1977) 15, 2653-65 report the preparation of polyphenylquinoxalines with pendant phenylethynyl groups and their thermal cure via intramolecular cycloaddition and the heating of the 2,2'-di (phenylethynyl)biphenyl moiety to produce a 9-phenyldibenz[a,c]anthracene moiety which enhances the Tg of the polymer.

The references Hergenrother, P. M.; *Macromolecules* (1981) 14, (4) 891-897; and Hergenrother, P. M.; *Macromolecules* (1981) 14, (4) 898-904 report on the preparation of poly(phenylquinoxalines) containing pendent phenylethynyl groups along the backbone, where these materials were prepared for evaluation as precursors for high thermally stable thermosets.

U.S. Pat. No. 5,138,028 and EP Pat. Appl. No. 443352 A2 910828 describe the preparation of polyimides, polyamic acids, polyamic acid esters, polyisoimides which are end-capped with diarylacetylenes. The cured products can be used for encapsulation of electronic devices, as adhesives, and as moldings.

WO 97/10193 discloses various multi-phenylethynyl compounds which can be used for coating a wide variety of substrates such as computer chips.

The reference Zhou, Q et al., *Polym. Preprint* (1993) 34(1), 193-4, describes the preparation of carbon ladder polymers via the cyclization reactions of acetylenes.

U.S. Pat. No. 5,179,188 describes polymers (oligomers) such as those described in U.S. Pat. No. 5,114,780 which are end-capped with reactive groups having double and triple bonds.

WO 91/16370 (1991) describes crosslinkable fluorinated aromatic ether compositions.

PCT/US96/10812 teaches preparation of phenylethynylated monomers for use in preparing polymers which can thermally crosslinked.

Integrated circuit and chip manufacturing require suitable polymeric coatings and materials for packaging and other application. However, despite various attempts to provide appropriate crosslinking of polymers for these application, the art has not managed to solve the problem of providing polymeric materials that fulfill at least one of the following requirements: improved coefficient of thermal expansion (CTE), improved hardness, improved adhesion resistance wherein one or all of these requirements is achieved without a significant loss of substrate adhesion, thermal stability, or both.

All references cited herein are incorporated herein by reference in their entireties.

BRIEF SUMMARY OF THE INVENTION

A polymeric composition comprising a first polymer chosen from a poly(arylene ether) polymer including polymer repeat units of the following structure:

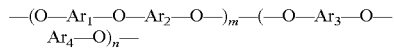

where $Ar_1$, $Ar_2$, $Ar_3$, and $Ar_4$ are identical or different aryl radicals, m is 0 to 1, n is 1−m; a polysulfone; a polyimide; a poly(etherketone); a polyurea; a polyurethane; and combinations thereof and a second polymer comprising a per(phenylethynyl) arene polymer derivative. Cured films containing the polymer can exhibit at least one of the following properties: Tg from 160° C. to 180° C., a dielectric constant below 2.7 with frequency independence, and a maximum moisture absorption of less than 0.17 wt %. Accordingly, the polymer is especially useful, for example, in interlayer dielectrics and in die-attach adhesives.

BRIEF DESCRIPTION OF SEVERAL VIEWS OF THE DRAWINGS

FIG. 1 provides an illustration of the polymeric network of a composition comprising a first polymer comprising a poly(arylene ether) polymer and a second polymer comprising a per(phenylethynyl)arene derivative.

DETAILED DESCRIPTION OF THE INVENTION

Described herein are polymeric compositions that comprises a first polymer chosen from a poly(arylene ether) polymer comprising polymer repeat units of the following structure:

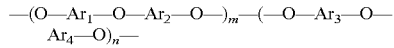

where $Ar_1$, $Ar_2$, $Ar_3$, and $Ar_4$ are identical or different aryl radicals, m is 0 to 1, n is 1−m; a polysulfone; a polyimide; a poly(etherketone); a polyurea; a polyurethane; and combinations thereof; and a second polymer derived from a per(phenylethynyl)arene or a per(phenylethynyl)arene derivative. While the polymeric composition defines the constituents included therein as a first polymer and a second polymer, it is not meant to imply that the composition is comprised solely of 2 polymers. It is anticipated that the polymeric composition described herein may include one or more first polymers and one or more second polymers. It is believed that the addition of a second polymer to the polymeric composition, or the addition of at least one polymer derived from a per(phenylethynyl)arene, may provide at least one of the following properties: high Tg (400° C. or greater) with minimal weight loss (0.5 wt % or less) at high temperatures (e.g., 400° C. or above); a CTE comparable to the CTE for silica, improved hardness (e.g., polymeric composition has a hardness that is greater than an equivalent polymeric composition that does not comprise the per(phenylethynyl)arene derivative) and combinations thereof. The aforementioned properties can be obtained without a significant loss of substrate adhesion, thermal stability, or both of the polymeric composition.

In one particular embodiment, there is provided a polymeric compositions that consists essentially of a first polymer chosen from a poly(arylene ether) polymer comprising polymer repeat units of the following structure:

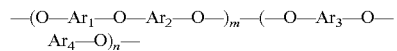

where $Ar_1$, $Ar_2$, $Ar_3$, and $Ar_4$ are identical or different aryl radicals, m is 0 to 1, n is 1−m; a polysulfone; a polyimide; a poly(etherketone); a polyurea; a polyurethane; and combinations thereof; and a second polymer derived from a per(phenylethynyl)arene or a per(phenylethynyl)arene derivative. In this particular embodiment, the polymeric composition may further included additional ingredients provided that the additional ingredients do not adversely affect at least one of the following properties: high Tg (400° C. or greater) with minimal weight loss (0.5 wt % or less) at high temperatures (e.g., 400° C. or above); a CTE comparable to the CTE for silica, improved hardness (e.g., polymeric composition has a hardness that is greater than an equivalent polymeric composition that does not comprise the per(phenylethynyl)arene derivative) and combinations thereof.

In yet another embodiment, there is provided a polymeric composition that consists of a first polymer chosen from a poly(arylene ether) polymer comprising polymer repeat units of the following structure:

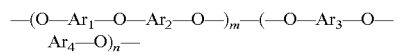

where $Ar_1$, $Ar_2$, $Ar_3$, and $Ar_4$ are identical or different aryl radicals, m is 0 to 1, n is 1−m; a polysulfone; a polyimide; a poly(etherketone); a polyurea; a polyurethane; and combinations thereof; and a second polymer derived from a per(phenylethynyl)arene or a per(phenylethynyl)arene derivative.

FIG. 1 provides an illustration of the polymeric network of a composition comprising a first polymer comprising a poly(arylene ether) polymer and an additional or second polymer comprising a per(phenylethynyl)arene derivative that forms a semipenetrating polymer network. The term "derivative" as used herein describes a polymer that is derived from a per(phenylethynyl)arene polymer.

The per(phenylethynyl)arene derivative can be added to the polymer composition in a variety of ways or, alternatively, the per(phenylethynyl)arene derivative can be formed in situ. In the latter embodiment, the second polymer is added to the polymeric composition via the in situ formation of the second polymer, such as, for example, by the Bergman cyclization of 1,2,4,5-tetra(phenylethynyl)benzene that is depicted in reaction Scheme 1.

In Scheme 1, the per(phenylethynyl)arene derivative polymer may be attached to one or more per(phenylethynyl)arene derivative polymers at the locations depicted at the dots below within the polymeric network in the reaction product of the Bergman Reaction. In this or other embodiments, the per(phenylethynyl)arene derivative polymer may be also attached to the first polymer at one or more of the dots such as the poly(arylene ether) polymer, a polysulfone, a polyimide, a poly(etherketone), a polyurea, a polyurethane, and combinations thereof to provide a cross-linked polymeric network.

Scheme 1: Bergman cyclization of 1,2,4,5-Tetra(phenylethynyl)benzene

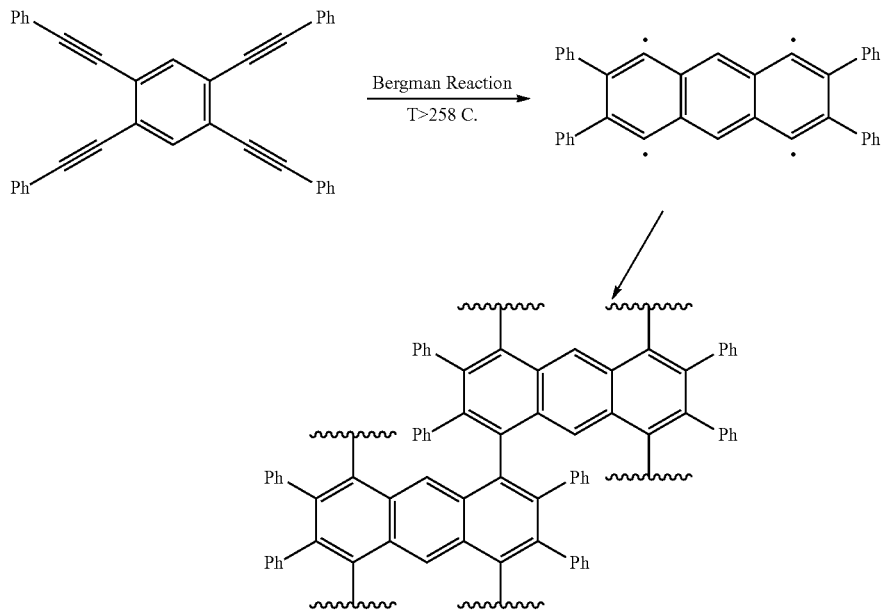

In another embodiment, the second polymer or per(phenylethynyl)arene polymer derivative (e.g., 1,2,4,5-tetra(phenylethynyl)benzene) is added to the first polymer which is at least one polymer chosen from a poly(arylene ether) polymer, a polysulfone, a polyimide, a poly(etherketone), a polyurea, a polyurethane, and combinations thereof. In these embodiments, the per(phenylethynyl)arene derivative polymer is miscible with the first polymer which created cross links with the first polymer upon cure. An example of the preparation of 1,2,4,5-tetra(phenylethynyl)benzene is shown in Scheme 2 which uses a thermal cure.

Scheme 2: Preparation of 1,2,4,5-Tetra(phenylethynyl)benzene

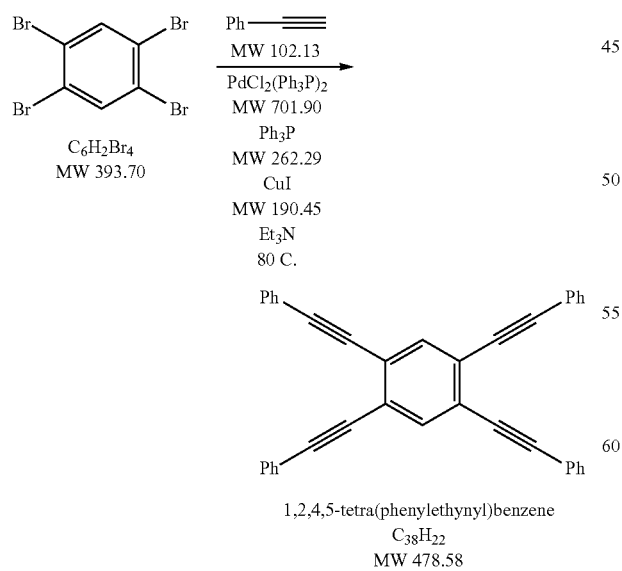

The following structure is an example of the per(phenylethynyl)arene polymer derivative that can be added to the first polymer to provide the polymeric compositions described herein.

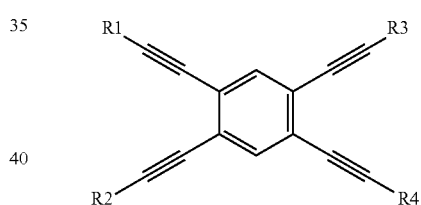

In the above structure, R1, R2, R3, and R4 are each independently selected from the following groups:

R1, R2, R3, R4 = 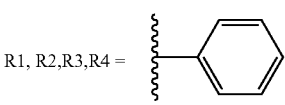

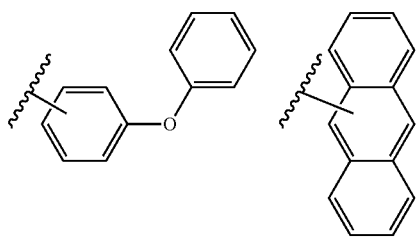

In certain embodiments, at least one of R1, R2, R3, and R4 is a different group. In other embodiments, at least one of R1, R2, R3, and R4 is the same group.

In certain embodiments, the first polymer comprises one or more poly(arylene) ether polymers such as those described in U.S. Pat. No. 6,060,170 which is incorporated herein by reference in its entirety. In one embodiment, the first polymer comprises a poly(arylene ether) polymer comprising repeating units of the structure:

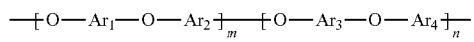

wherein m=0 to 1.0; and n=1.0−m. The monomers $Ar_1$, $Ar_2$, $Ar_3$ and/or $Ar_4$, which represent one or more aromatic ring structures can be selected from the following structures (in the dihalogenated form, $Ar_2$ and $Ar_4$, or the dihydroxy form, $Ar_1$ and $Ar_3$, prior to polymerization, preferably the dibrominated form for the dihalogenated form and preferably the potassium, sodium or lithium form for the dihydroxy, respectively, wherein the mix of monomers is such that a dihalogenated monomer, $Ar_2$ and/or $Ar_4$, and a dihydroxy monomer, $Ar_1$ and/or $Ar_3$, are selected for co-etherification in the Ullman condensation; and $Ar_1$, $Ar_2$, $Ar_3$ and $Ar_4$ together cannot be isomeric equivalents unless compound I is present, because of crystallization problems, but subsets of less than all the Ar structures can be isomeric equivalents):

A—phenylene:

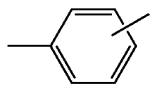

B—biphenyl diradical:

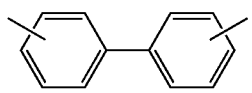

C—para-terphenyl diradical:

D—meta-terphenyl diradical:

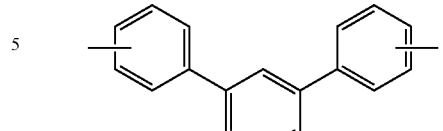

E—ortho-terphenyl diradical:

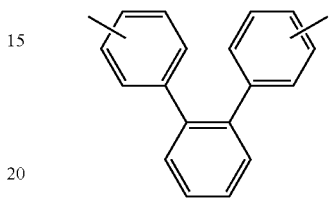

F—naphthalene diradical:

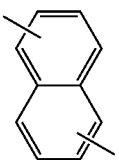

G—anthracene diradical:

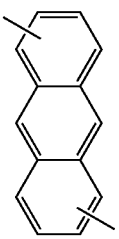

H—phenanthrene diradical:

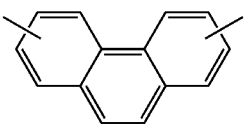

I—diradical of 9,9-diphenylfluorene of the type:

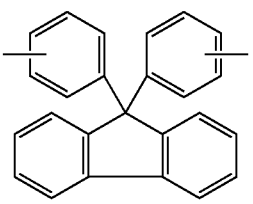

J—4,4'-diradical of dibenzofuran

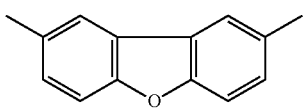

In certain embodiments, the polyarylene ether polymers which are grafted are non-functional, other than the presence of the graft, in that they are chemically inert and they do not bear any functional groups that are detrimental to their application in the fabrication of microelectronic devices. They do not have carbonyl moieties such as amide, imide, and ketone, which promote adsorption of water. They do not bear halogens such as fluorine, chlorine, bromine, and iodine which can react with metal sources in metal deposition processes. They are composed of essentially aromatic carbons, except for the bridging carbon in the 9,9-fluorenylidene group, which has much of the character of aromatic carbons due to its proximity to aromatic structures. For purposes of the present invention, that carbon is deemed to be a perphenylated carbon. In the case of non-functional poly(arylene ether) polymers, they do not have bridging groups other than the ether linkage, and more specifically they do not have sulfur linkages. In other embodiments, the polyarylene ether polymers which are grafted are functional.

Specific example of this grafting process for grafting a poly(arylene ether) is as follows:

The solvent is selected from the group consisting of tetrahydrofuran, glycime, ethyl ether, butyl ethyl ether, tert-butyl methyl ether, 2-methoxyethyl ether, di(ethylene glycol) diethyl ether and mixtures thereof.

Some examples (not inclusive) of specific ketones which can be grafted onto aromatic polymers and lend themselves to thermally induced crosslinking are as follows:

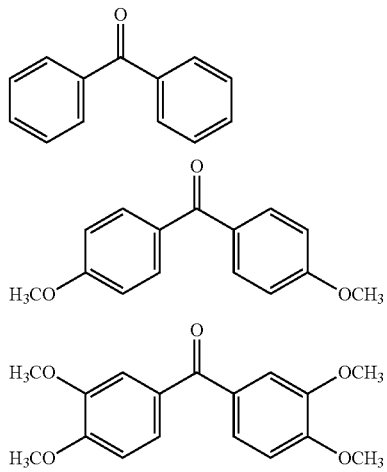

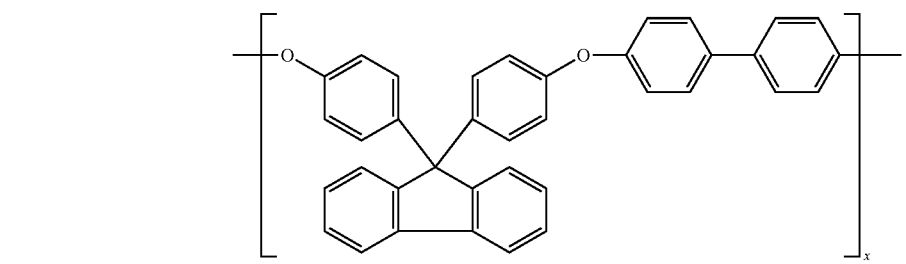

1) tert-butyllithium
   tetrahydrofuran (THF)
   -40 to -10 C.
2) 3,3',4,4'-tetramethoxybenzophenone
   -10 to 25 C.
3) acetic acid

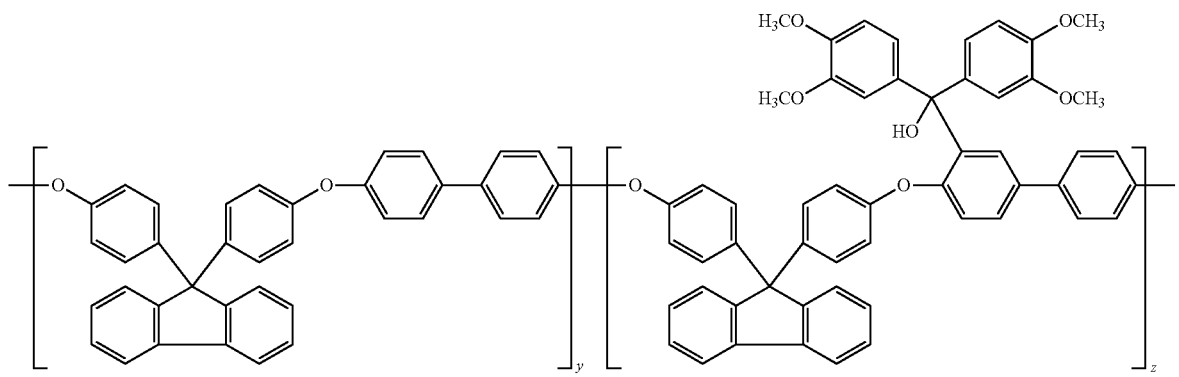

-continued

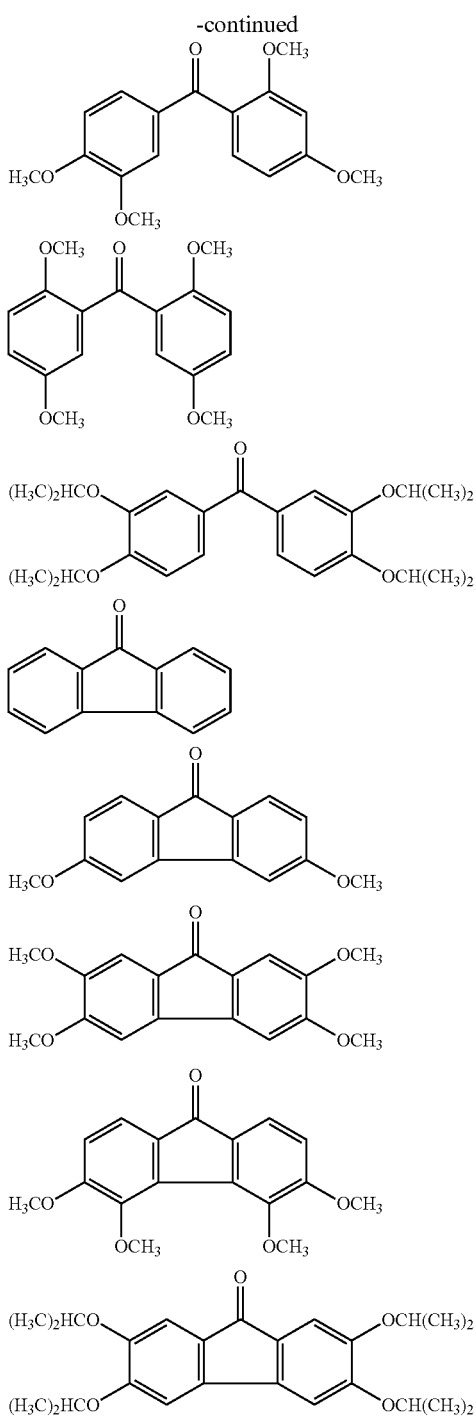

In one embodiment, the first polymer comprises a poly(arylene ether) polymer having a graft which graft can be thermally induced to crosslink the polymer and has the following structure:

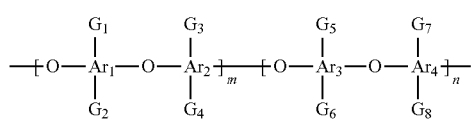

In the above structure, m=0 to 1.0; and n=1.0−m; and A1, Ar2, Ar3 and Ar4 are individually arylene radicals, and G1-8 is individually:

H,

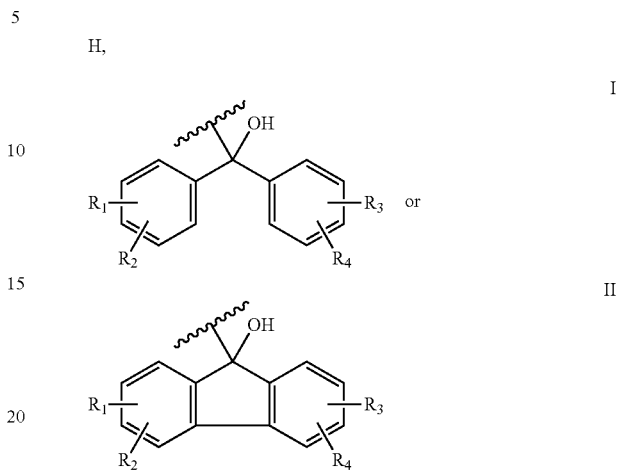

or mixtures thereof, wherein Z is the average number of G radicals which are I or II per repeating unit of said polymer and Z is in the range of 0.1 to 4.0, where $R_1$, $R_2$, $R_3$ and $R_4$ are individually H or alkoxy radical, wherein the alkoxy radical can have a normal or branched alkyl radical of $C_{1-8}$. In this or other embodiments, the poly(arylene ether) polymer consists essentially of non-functional repeating units wherein $Ar_1$, $Ar_2$, $Ar_3$ and $Ar_4$ are individually arylene radicals selected from the group consisting of;

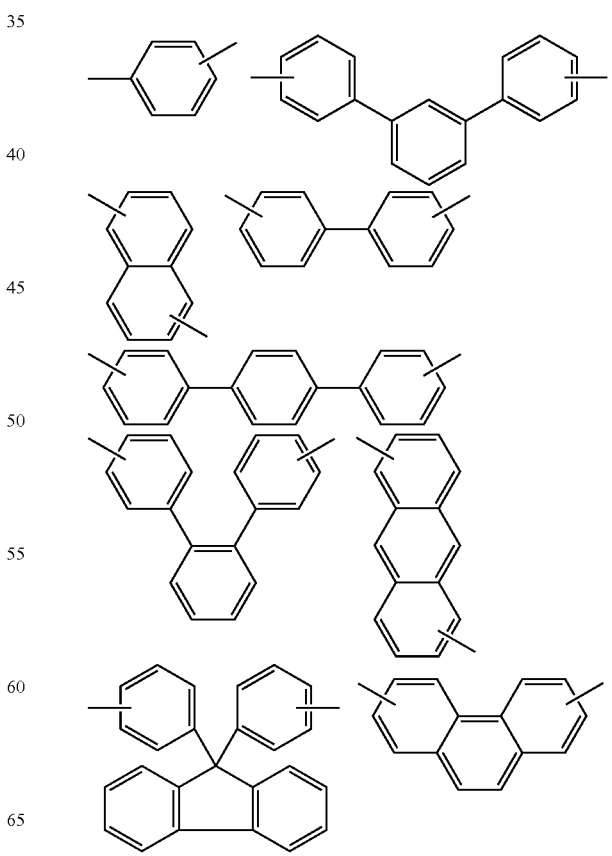

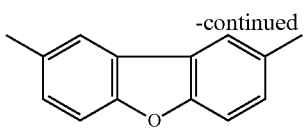

and mixtures thereof, but Ar$_1$ and Ar$_2$ or Ar$_3$ and Ar$_4$, other than the diradical 9,9-diphenylfluorene, are not isomeric equivalents.

In one particular embodiment, the polyarylene ether polymer is grafted and has repeating units of a structure:

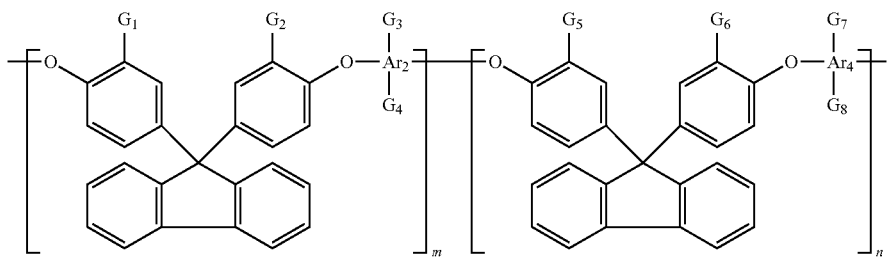

wherein G$_{1-8}$ are as defined above; m=0 to 1.0; and n=1.0−m; and Ar$_2$ and Ar$_4$ are individually arylene radicals selected from the group consisting of;

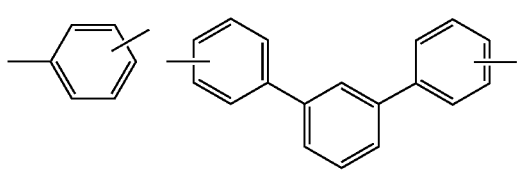

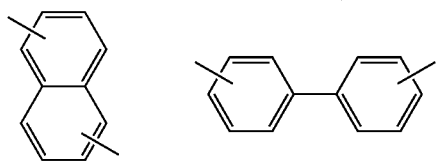

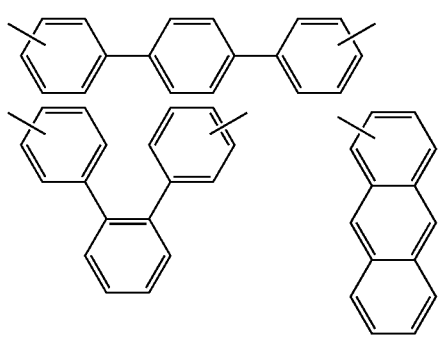

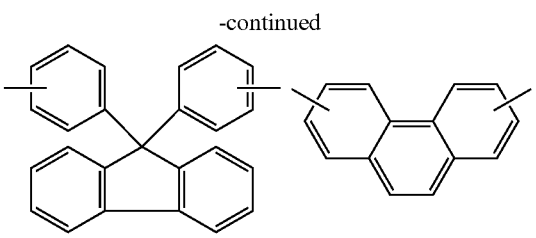

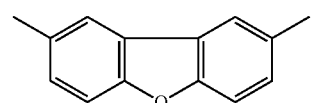

and mixtures thereof.

Not to be bound by theory, there are several mechanisms by which the thermal induced crosslinking can occur. These can be visualized as follows:

First Stage of Thermally Induced Crosslinking Reaction

The first stage of thermally induced reaction (cure) involves a condensation reaction which involves the loss of water. This reaction occurs in the temperature range of 200-260° C. The reaction can occur intramolecularly, resulting in no crosslinking. However, it can also occur intermolecularly so that a crosslink is formed as shown below:

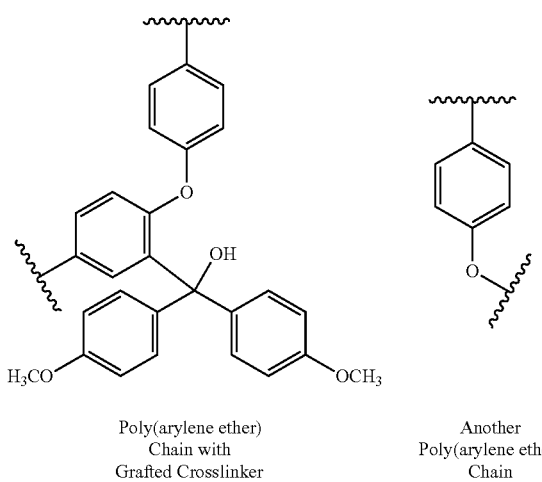
Poly(arylene ether) Chain with Grafted Crosslinker

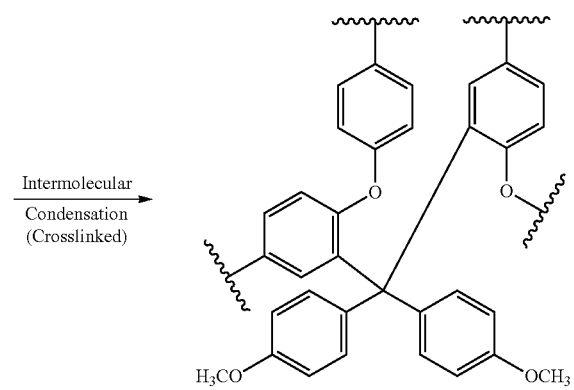
Another Poly(arylene ether) Chain

Intermolecular Condensation (Crosslinked)

Intramolecular Condensation (Not Crosslinked)

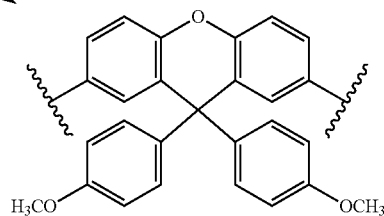

Second Stage of Thermally Induced Crosslinking Reaction

With appropriate substituents present on the grafted crosslinker, secondary crosslinking can also occur. These reactions generally occur at temperatures of 300-450° C. Below are some examples.

With para-methoxy groups on the graft (one on each aromatic ring of the graft), the secondary stage of thermally induced crosslinking can be done in two different ways. In air (oxygen) at 350-400° C., the para-methoxyphenyl groups oxidize to ortho-benzoquinone type groups. At these temperatures, the ortho-benzoquinone groups react quickly with other polymeric chains in order to form crosslinks. In an inert gas, such as nitrogen, at 425-450° C., methanol is lost and benzyne type appendages are formed. These appendages react quickly with other polymeric chains in order to form crosslinks. If there are two methoxy groups, (ortho or para to each other) on each ring, the ortho-benzoquinone type group can be formed without the need for air (oxygen) and will undergo similar crosslinking. Similar, thermally induced transformations of dialkoxybenzenes to benzoquinone type structures have been reported by Schraa, et. al., *J. Chem. Soc. Perkin Trans.* 2 (1994) 189-197. However, they do not recognize the potential for use of this type of transformation in generating a moiety which can undergo subsequent condensation reactions.

In other embodiments, the first polymer comprises a polymer chosen from a polysulfones, a polyimides, a polyamides, a poly(etherketone)s, a poly(urea)s, a poly(urethane)s, and combinations thereof. The foregoing list of polymers may be added to the polymeric composition in addition to, or alternatively in place of, the poly(arylene ether) polymer.

The polymeric composition may be cured in a number of ways known to one of skill in the art. In one embodiment, the polymeric composition is cured using a thermal cure at a temperature ranging from 100 to 400° C. In another embodiment, the polymeric composition is cured using an ultraviolet light cure. In a further embodiment, the polymeric composition is cured using a combination of thermal curing and ultraviolet light curing.

In certain embodiments, the polymeric compositions described herein may be used in a multichip module wherein a substrate typically made of silicon, glass or ceramic supports high density, multilayer interconnects in which the dielectric material providing insulation between the various layers contains the polymer of the present invention. On the interconnects are mounted semiconductor chips or integrated circuits which are connected to each other by electrical conductors in the interconnect. The substrate may also contain electrical conductors, for example, for power and ground. Lead frames provide connections to external circuitry. In such multilayer interconnects, layers of electrical connections are separated from each other by the dielectric materials containing the polymers of the present invention. The polymeric compositions described herein can also separate various regions of conductors, such as between various discrete conductors in a common layer. A via can provide connection between the various layers as necessary. The interconnect is connected to an integrated circuit chip by a bond pad. The via can be in a stacked pillar design, although other designs conventional in the art, such as stair-stepped or nested via designs, can be used. Other multichip module designs in which the polymeric compositions described herein can be used are known in the prior art.

The polymeric compositions described herein, more specifically in their crosslinked form, can also be used as interlayer dielectrics in an interconnect associated with a single integrated circuit chip. An integrated circuit chip would typically have on its surface plural layers of the crosslinked, grafted polymer dielectric and multiple layers of metal conductors. It can also include regions of the crosslinked, grafted poly(arylene ether) dielectric between discrete metal conductors or regions of conductor in the same layer or level of an integrated circuit. The grafted polymer can also be used in conjunction with conventional silicon, where the grafted polymer is used between the metal lines on a layer with silicon used as the dielectric material between layers of conductor material.

The polymeric compositions described herein can further be used as protective coatings on integrated circuit chips for protection against alpha particles. Semiconductor devices are susceptible to soft errors when alpha particles emitted from radioactive trace contaminants in the packaging or other nearby materials strike the active surface. An integrated circuit can be provided with a protective coating of the grafted polymer of the present invention. Typically, an integrated circuit chip would be mounted on a substrate and held in place with an appropriate adhesive. A coating of the grafted polymers of the present invention provides an alpha particle protection layer for the active surface of the chip. Optionally, additional protection is provided by encapsulant made of, for example, epoxy or a silicone.

The polymeric compositions described herein, preferably in their crosslinked form, can also be used as a substrate (dielectric material) in circuit boards or printed wiring boards. The circuit board made up of the polymeric compositions described herein has mounted on its surface patterns for various electrical conductor circuits. The circuit board may include, in addition to the polymeric compositions described herein various reinforcements, such as woven non-conducting fibers, such as glass cloth. Such circuit boards may be single sided, as well as double sided or multilayer.

Films or coatings of the polymeric compositions described herein can be formed by solution techniques such as spraying, spin coating or casting, with spin coating being preferred. Preferred solvents are 2-ethoxyethyl ether, cyclohexanone, cyclopentanone, toluene, xylene, chlorobenzene, N-methylpyrrolidinone, N,N-dimethylformamide, N,N-dimethylacetamide, methyl isobutyl ketone, 2-methoxyethyl ether, 5-methyl-2-hexanone, γ-butyrolactone, and mixtures thereof. Typically, the coating thickness is between about 0.1 to about 200 microns. As a dielectric interlayer.

Adhesion promoters can also be used to adhere the polymeric compositions described herein to the appropriate substrates. Such promoters are typified by hexamethyldisilazane, which can be used to interact with available hydroxyl functionality that may be present on a surface, such as silicon dioxide, which has been exposed to moisture or humidity that creates such hydroxyl functionality.

The following examples illustrate the polymeric compositions described herein are not intended to limit it in any way. In the following examples, unless otherwise specified, area percent gas chromatography (GC) analysis was conducted using a 25 m long with a 0.17 micron film thickness HP-5 column. With the exception of Tear Strength, the test results in Tables 1 and 2 for the physical properties of the polymeric coatings were obtained using the ASTM D-412 standard at a pull rate of 2 inches/minute. The tear strength was obtained using the ASTM D-624 standard. The glass transition temperature for the various polymeric compositions was measured by differential scanning calorimetry (DSC) using ASTM D696.

EXAMPLES

Example 1

Preparation of the Per(phenylethynyl)arene polymer 1,2,4,5-tetra(phenylethynyl)benzene

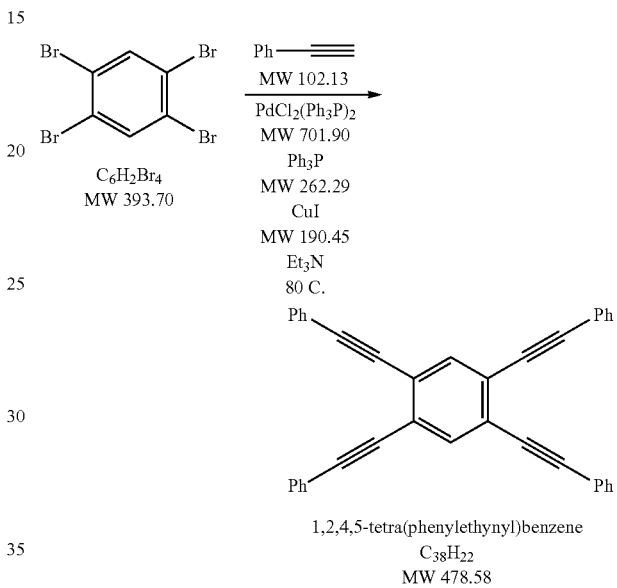

A three-necked, glass reaction vessel is fitted with a thermometer, magnetic stir bar, condenser, static nitrogen inlet, and addition funnel then charged with 9.00 grams (g) (0.0229 mol) of 1,2,4,5-tetrabromobenzene, 0.2232 g (0.318 mmol) of bis(triphenylphosphine)palladium (II) chloride, 0.1668 g (0.636 mmol) of triphenylphosphine, 0.1211 g (0.636 mmol) of copper (I) iodide, and 180 g of triethylamine. The solution was heated to 70° C. with stirring. A solution of 9.34 g (0.0914 mol) of phenylacetylene and 50 g of triethylamine was then added drop-wise over the course of 2 hours. The addition rate was such that the temperature of the reaction mixture did not exceed 80° C. After complete addition, the reaction mixture was stirred for an additional 17 hours at 80° C. The reaction mixture is then cooled to room temperature and the precipitate is removed via filtration. The filter cake is washed with the aid of tetrahydrofuran (THF). Volatiles from the combined solutions, including washings, were then evaporated under reduced pressure with the aid of a rotoevaporator at a maximum bath temperature of 70° C. The remaining, concentrated solution was then precipitated with rapid agitation by pouring into a mixture of 200 mL methanol and 200 mL of water. The precipitate was collected via vacuum filtration. The precipitate is then dissolved in a minimal amount (ca. 200 mL) of THF then treated with 20 g of polyvinyl pyridine) resin (Reillex™ 425) and 100 g silica gel column contained in a resin column. The solvent is evaporated. The crude product is recrystallized with toluene (<100 mL), isolated yield after recrystallization ~58% (6.36 g).

Example 2

Preparation of Polymeric Composition comprising PAE-2 and 1,2,4,5-tetrakis(phenylethynyl)

0.2999 g of PAE-2 and 0.2008 g of 1,2,4,5-tetrakis(phenylethynyl) prepared in accordance with Example 1 were combined in ~15 mL of tetrahydrofuran and dried briefly at 100° C. on a hotplate, followed by overnight at 120° C. in an oven. The residue was subjected to 220° C. in nitrogen atmosphere for 30 minutes (10 C/min ramp), which resulted in a weight loss of 1.24%, then cooled and reheated to 400° C. at 10° C./minute and held at 400° C. for 120 minutes. The residue had 3.42% weight loss at 400° C. isothermal. The DSC showed a melt endotherm at 185° C. and a two peak exotherm at ~305° C. and 390° C. on the first heat. The second heat was predominantly featureless, indicating crosslinking had occurred, and an interpenetrating network had formed.

Example 3

Adhesion Results for Polymeric Composition comprising PAE-2 and 1,2,4,5-tetrakis(phenylethynyl)benzene A solution was prepared from 1,2,4,5-tetrakis(phenylethynyl)benzene and PAE-2 (prepared in accordance with Example 2) was as follows:

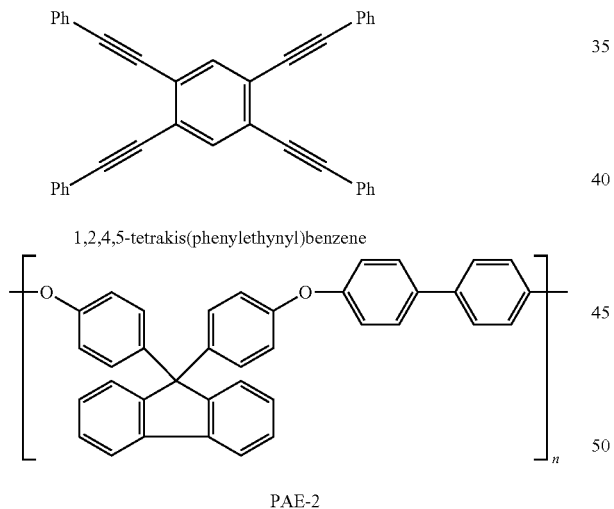

1,2,4,5-tetrakis(phenylethynyl)benzene

PAE-2

A 0.3997 g portion of 1,2,4,5-tetrakis(phenylethynyl)benzene and 0.6003 g of the poly(arylene ether) PAE-2 were dissolved in 9.0 g of distilled cyclohexanone. The solution was applied to six 1"×4.25"×0.32" cold roll steel coupons provided by Act Laboratories Inc., Part #APR14839. The coupons were overlapped to form three test pieces with 0.5 sq. inch overlap area. All three pieces were heated to 400° C. and held at temperature for 10 minutes with a 10 lb. weight resting on each piece. The three pieces were subjected to Lap Shear Analysis, ASTM method D-1002 (metal). The results of this analysis are provided in the Table II below. The results show good adhesion for the cured polymer matrix to the steel substrate.

TABLE II

| Specimen number | Stress at Max Load (psi) | Load at Max. Load (lbf) |
|---|---|---|
| Example 3A | 787.8 | 393.9 |
| Example 3B | 780 | 390 |
| Example 3C | 1023 | 511.3 |
| Mean: | 863.4 | 431.7 |
| Standard Deviation: | 137.8 | 68.9 |

The invention claimed is:

1. A composition comprising:
a first polymer chosen from a poly(arylene ether) polymer including polymer repeat units of the following structure:

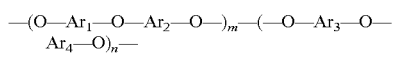

—(O—Ar$_1$—O—Ar$_2$—O—)$_m$—(—O—Ar$_3$—O—Ar$_4$—O)$_n$— where Ar$_1$, Ar$_2$, Ar$_3$, and Ar$_4$ are identical or different aryl radicals, m is 0 to 1, n is 1–m; a polysulfone; a polyimide; a polyamide; a poly(etherketone); a polyurea; a polyurethane; and combinations thereof; and a second polymer comprising a per(phenylethynyl)arene polymer derivative.

2. The composition of claim 1, wherein the aryl radicals are independently selected from the group consisting of:

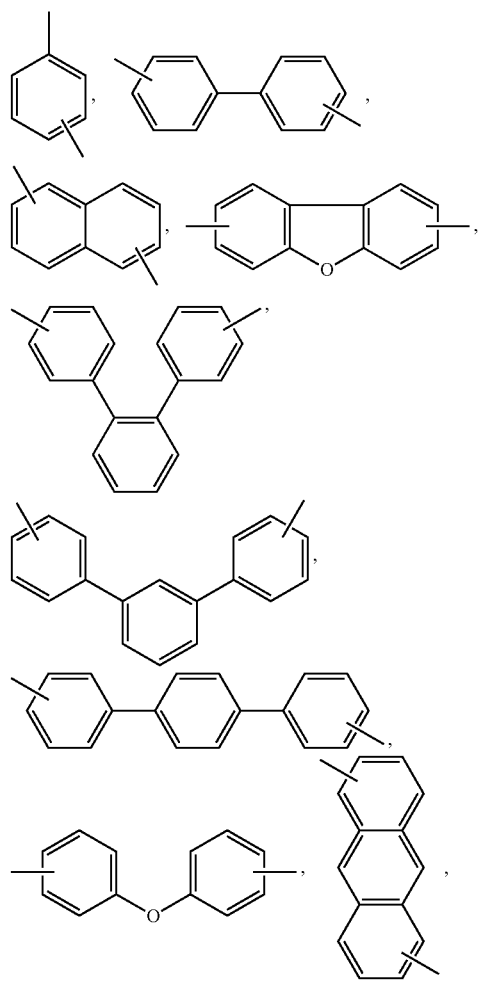

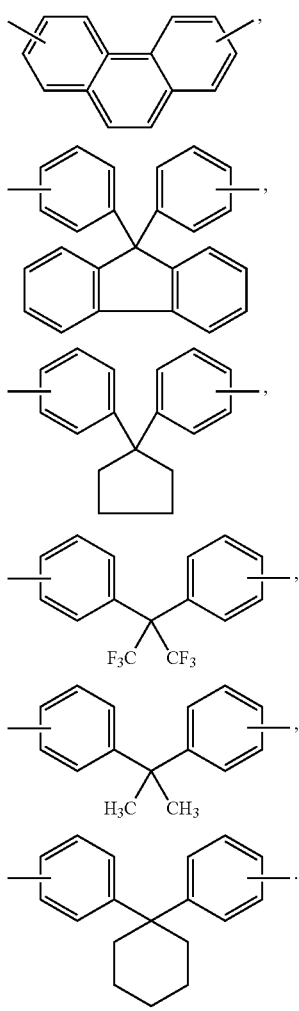

3. A polymer composition comprising:
a first polymer chosen from a polymer poly(arylene ether) polymer having a graft which graft can be thermally induced to crosslink the polymer, wherein said polymer having said graft has the structure:

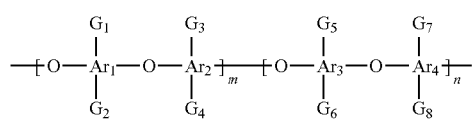

wherein m=0 to 1.0; and n=1.0−m; and $Ar_1$, $Ar_2$, $Ar_3$ and $Ar_4$ are individually arylene radicals, and $G_{1-8}$ are individually: H,

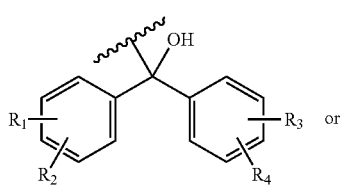

I

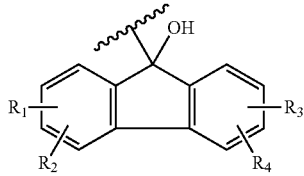

II or mixtures thereof, wherein Z is the average number of G radicals which are I or II per repeating unit of said polymer and Z is in the range of 0.1 to 4.0, where $R_1$, $R_2$, $R_3$ and $R_4$ are individually H or alkoxy radical, wherein the alkoxy radical can have a normal or branched alkyl radical of $C_{1-8}$, and further wherein said poly(arylene ether) polymer consists essentially of non-functional repeating units wherein $Ar_1$, $Ar_2$, $Ar_3$ and $Ar_4$ are individually arylene radicals selected from the group consisting of;

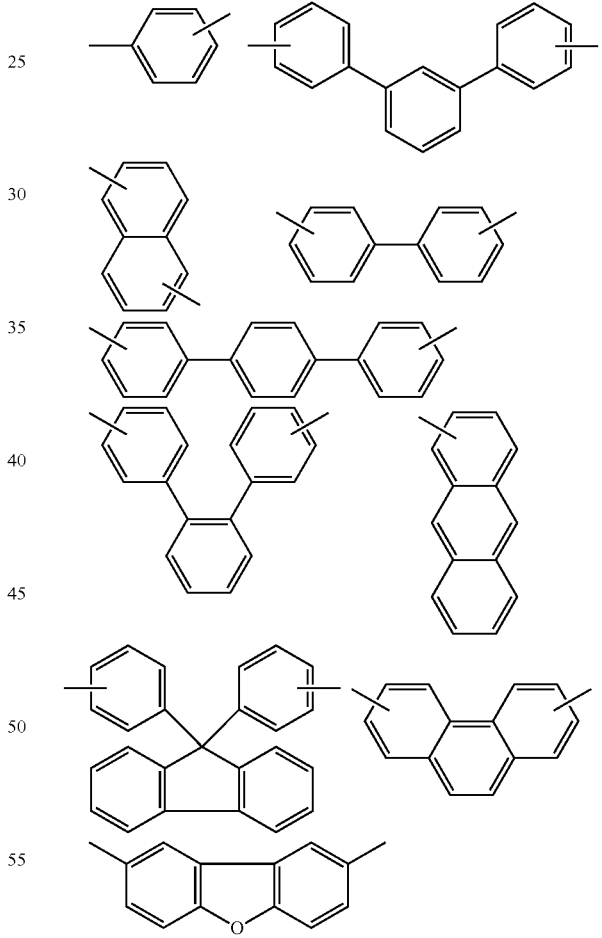

and mixtures thereof, but $Ar_1$ and $Ar_2$ or $Ar_3$ and $Ar_4$, other than the diradical 9,9-diphenylfluorene, are not isomeric equivalents; a polysulfone; a polyimide; a polyamide; a poly(etherketone); a polyurea; a polyurethane; and combinations thereof; and
a second polymer comprising a per(phenylethynyl)arene polymer derivative.

4. The composition of claim 3 wherein the grafted polymer has repeating units of a structure:

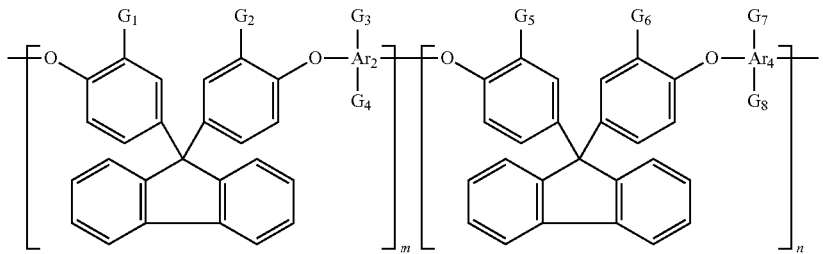

wherein $G_{1-8}$ are as defined above; m=0 to 1.0; and n=1.0−m; and $Ar_2$ and $Ar_4$ are individually arylene radicals selected from the group consisting of;

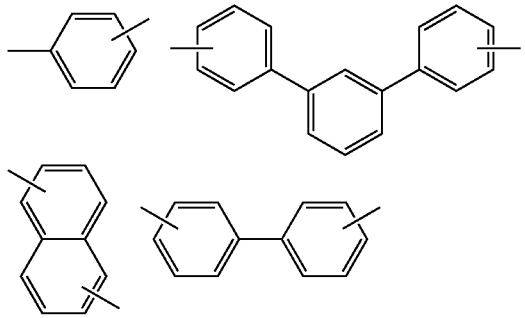

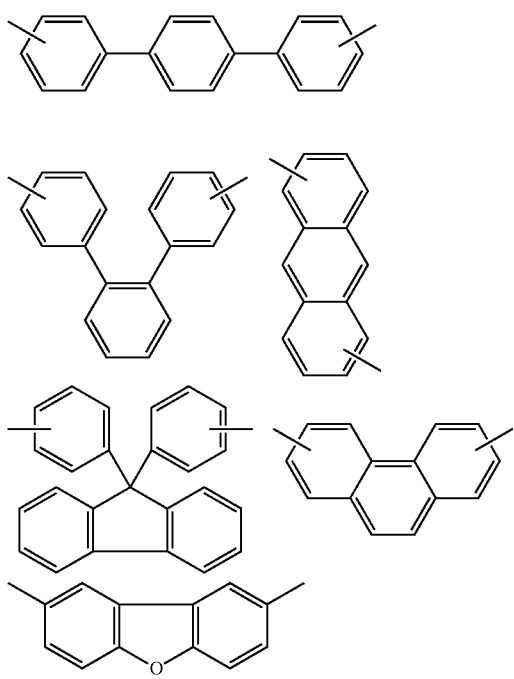

and mixtures thereof.

5. The composition of claim 4 wherein the grafted polymer comprises a repeating polymer unit:

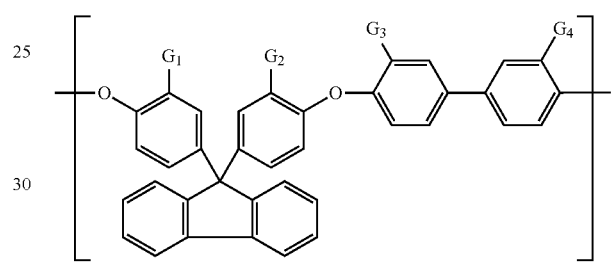

wherein grafts $G_{1-4}$ are individually selected from the group consisting of: H,

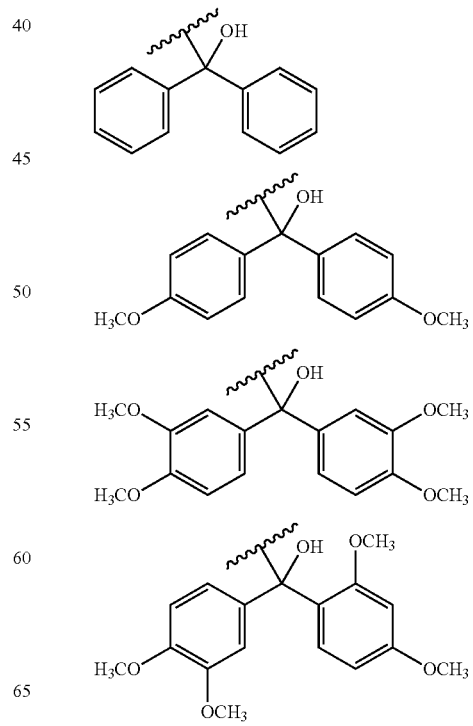

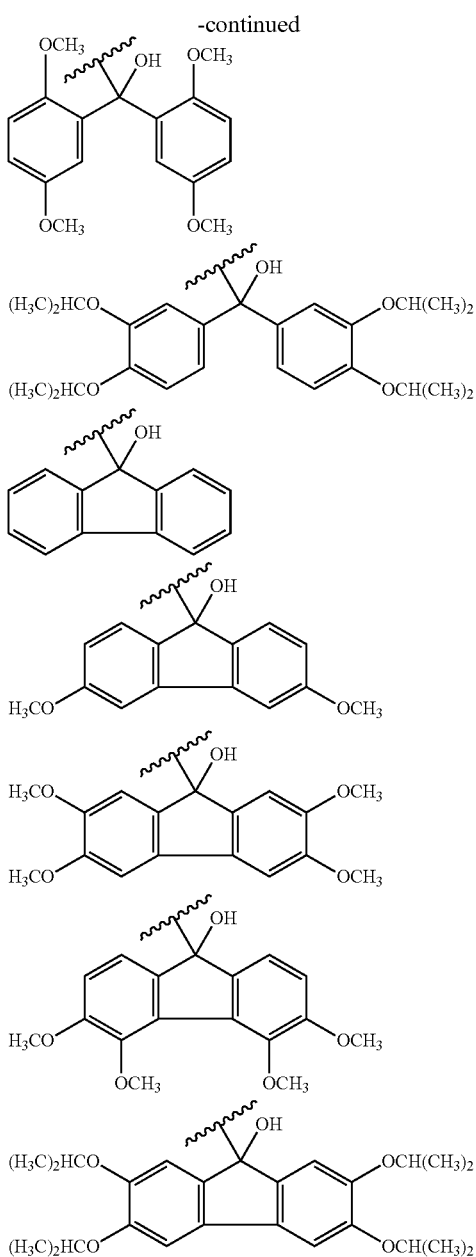

and mixtures thereof, where Z is the average number of G radicals per polymer unit and Z is in the range of 0.1 to 4.0.

6. The composition of claim 3 wherein the grafted polymer has a repeating polymer unit:

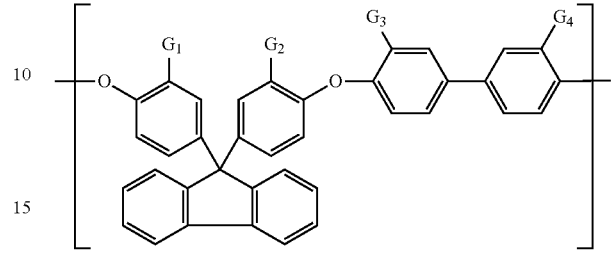

wherein $G_{1-4}$ are individually H or:

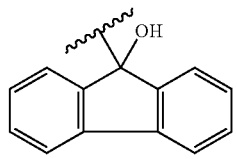

III where Z is the average number of G radicals per polymer unit and Z is in the range of 0.1 to 4.0.

7. The composition of claim 6 wherein Z is in the range of 0.25 to 1.5.

8. The composition of claim 7 wherein Z is approximately 0.9.

9. The composition of claim 3 wherein said composition is crosslinked and comprises a dielectric material on a microelectronic device.

10. The composition of claim 9 wherein said dielectric material is provided adjacent conductive regions of an integrated circuit.

11. The composition of claim 3 wherein said polymer and said graft are crosslinked.

* * * * *

UNITED STATES PATENT AND TRADEMARK OFFICE
CERTIFICATE OF CORRECTION

PATENT NO. : 8,502,401 B2
APPLICATION NO. : 13/058688
DATED : August 6, 2013
INVENTOR(S) : Burgoyne, Jr. et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 165 days.

Signed and Sealed this
Fifteenth Day of September, 2015

Michelle K. Lee
*Director of the United States Patent and Trademark Office*